United States Patent
Sakaguchi

(10) Patent No.: US 8,094,695 B2
(45) Date of Patent: Jan. 10, 2012

(54) CURRENT DRIVE CIRCUIT

(75) Inventor: Makoto Sakaguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 431 days.

(21) Appl. No.: 12/179,673

(22) Filed: Jul. 25, 2008

(65) Prior Publication Data

US 2009/0034565 A1     Feb. 5, 2009

(30) Foreign Application Priority Data

Jul. 31, 2007   (JP) .................................. 2007-199444

(51) Int. Cl.
*H01S 3/00* (2006.01)
(52) U.S. Cl. ............... 372/38.02; 372/29.015; 372/38.07
(58) Field of Classification Search ............. 372/29.015, 372/38.02, 38.07
See application file for complete search history.

(56) References Cited

U.S. PATENT DOCUMENTS

2005/0213622 A1 *   9/2005  Diaz .......................... 372/38.02

FOREIGN PATENT DOCUMENTS

| JP | 62278809 A | * | 12/1987 |
| JP | 2005-101154 A | | 4/2005 |
| JP | 2006-114895 A | | 4/2006 |

\* cited by examiner

*Primary Examiner* — Jessica Stultz
*Assistant Examiner* — Joshua King
(74) *Attorney, Agent, or Firm* — Sughrue Mion, PLLC

(57) ABSTRACT

A current drive circuit according to the present invention includes: a first current source and a second current source ($I101$, $I102$); a first current mirror ($CM103$) for generating a first mirror current of a current ($I_2$) generated by the second current source ($I102$); a second current mirror ($CM106$) for generating a second mirror current of the current ($I_2$) generated by the second current source ($I102$); and a third current mirror ($CM101$) for generating a mirror current ($I_{OUT1}$) of a current which is generated by the first current source ($I101$) and which is corrected according to a difference between the first mirror current and the second mirror current, to supply the current to a load ($LD101$).

6 Claims, 4 Drawing Sheets

CURRENT DRIVE CIRCUIT

BACKGROUND OF THE INVENTION

1. Field of the Invention

The present invention relates to a current drive circuit. For example, the present invention relates to a current drive circuit suitable for driving a current driving element such as a laser diode that is mounted in an optical disk device and is required to be supplied with a stable drive current.

2. Description of Related Art

In an optical information processor, a laser diode (hereinafter, referred to also as "LD") is widely used as a light source. For example, a laser diode is used as a light source for an optical head in an optical disk device. The laser diode is driven by a current drive circuit. Accordingly, it is necessary to supply a stable drive current to the laser diode regardless of a power supply voltage variation. As a current drive circuit of this type, a current-mirror type circuit is widely employed.

In general, a ratio of the magnitude of currents flowing through two metal-oxide-semiconductor field-effect transistors (MOSFETs) constituting a current mirror, that is, a mirror ratio is determined based on a ratio of the size (channel width W/channel length L) of two MOSFETs. However, it is known that a current flowing through the MOSFETs is affected by a source-drain voltage $V_{DS}$ due to a channel length modulation effect. Accordingly, if the effect is not taken into account, there is a fear that, even when the W/L ratio is correctly set, a stable drive current cannot be obtained because of the power supply voltage variation due to noise or the like.

Japanese Unexamined Patent Application Publication No. 2005-101154 and Japanese Unexamined Patent Application Publication No. 2006-114895, which is filed as a divisional application thereof, each discloses a circuit configuration for stabilizing the drive current against the power supply voltage variation. FIG. 4 is a circuit diagram shown in FIG. 1 of Japanese Unexamined Patent Application Publication No. 2005-101154.

The circuit shown in FIG. 4 includes a laser diode LD1, an output current setting current source IS, an LD output terminal T1, an output MOSFET M1, a MOSFET M2, an output switch SW1, a MOSFET M3, a MOSFET M4, a first dummy LD LD2, a MOSFET M5, a MOSFET M6, an output switch for the first dummy LD SW2, a MOSFET M7, a MOSFET M8, a second dummy LD LD3, a MOSFET M9, a MOSFET M10, a MOSFET MN1, a MOSFET M12, a MOSFET M13, a MOSFET M14, and a correction amount detection amplifier AMP.

In this case, the MOSFET M1 and the MOSFET M2 constitute a current mirror CM1.

The MOSFET M5 and the MOSFET M6 constitute a current mirror CM2.

The MOSFET M9, the MOSFET M10, the MOSFET MN1, and the MOSFET M12 constitute a cascode current mirror CM3.

The MOSFET M14 and the MOSFET M13 constitute a current mirror CM4.

The MOSFET M14 and the MOSFET M8 constitute a current mirror CM5.

Further, the MOSFET M14 and the MOSFET M4 constitute a current mirror CM6.

Next, a description is given of operations of the circuit shown in FIG. 4.

First, a current $I_1$ proportional to a desired current $I_{OUT1}$, which is caused to flow through the laser diode LD1, flows from the output current setting current source IS. When the output ON/OFF switch SW1 is turned on, the current is supplied as the current $I_{OUT1}$ to the laser diode LD1 via the current mirror CM6, the current mirror CM1, and the LD output terminal T1, whereby the laser diode LD1 emits light. In this case, it is assumed that no current flows through the MOSFET M3.

Assuming that the power supply voltage varies due to an effect of noise or the like, a terminal voltage $V_{LD}$ of the laser diode LD1 is substantially constant, while a voltage V of the power supply VDD varies. In other words, a voltage $V_{DS1}$ applied between a drain and a source of the MOSFET M1 varies. As a result, owing to the channel length modulation effect of the MOSFET, a current flowing through the MOSFET M1 fluctuates, which causes a problem. In this case, it is necessary to supply a large current to the current mirror CM1, which is formed of the MOSFET M1 and the MOSFET M2, in a state where a sufficient amount of the voltage $V_{DS1}$ cannot be supplied. As a result, the current mirror CM1 cannot be implemented with a cascode configuration.

Next, a description is given of a circuit operation for suppressing the current fluctuation.

First, a current proportional to the current $I_1$, which flows through the MOSFET M14, flows through the MOSFET M13 that constitutes the current mirror CM4 with the MOSFET M14. The current is supplied as a current $I_3$ to the second dummy LD LD3 via the cascode current mirror CM3.

On the other hand, the current proportional to the current $I_1$, which flows through the MOSFET M14, also flows through the MOSFET M8 that constitutes the current mirror CM5 with the MOSFET M14. The current is supplied as a current $I_4$ to the first dummy LD LD2 via the switch SW2, which is constantly turned on, and the current mirror CM2.

In this case, it is assumed that the first dummy LD LD2 and the second dummy LD LD3 have the same characteristics. In a case where the power supply voltage is constant at the voltage V, when the current flowing through the current mirrors CM2, CM3, CM4, and CM5 and the MOSFET M7 is set so as to satisfy $I_3=I_4$, an anode voltage of the first dummy LD LD2 becomes equal to an anode voltage of the second dummy LD LD3. As a result, a potential difference between an inverting input terminal and a non-inverting input terminal of the correction amount detection amplifier AMP is eliminated.

Consideration is made of a case where the power supply voltage varies under the set conditions, for example, a case where the voltage of the power supply VDD increases. The current $I_3$ supplied to the second dummy LD LD3 is substantially constant because the current mirror CM3 has a cascode configuration. On the other hand, since the current mirror CM2 is not implemented with the cascode configuration and a voltage $V_{D33}$ applied between a drain and a source of the MOSFET M5 is high, the current $I_4$ supplied to the first dummy LD LD2 has a large current value owing to the channel length modulation effect, whereby $I_3<I_4$.

Accordingly, the anode voltage of the first dummy LD LD2 becomes higher than the anode voltage of the second dummy LD LD3, and an output voltage of the correction amount detection amplifier AMP decreases. Thus, the current flowing through the MOSFET M7 becomes smaller, with the result that $I_3=I_4$. Therefore, the current flowing through the first dummy LD LD2 remains constant regardless of power supply variations.

In contrast, when the power supply voltage decreases, the anode voltage of the first dummy LD LD2 becomes lower than the anode voltage of the second dummy LD LD3, and the output voltage of the correction amount detection amplifier AMP increases. Thus, the current flowing through the MOSFET M7 becomes larger, with the result that $I_3=I_4$. Accordingly, the current flowing through the first dummy LD LD2 remains constant regardless of power supply variations.

A correction current flowing through the MOSFET M7 is also caused to flow through the MOSFET M3 in a similar manner, whereby the current flowing through the laser diode LD1 can be set constant regardless of power supply variations.

However, in the circuit configuration disclosed in each of Japanese Unexamined Patent Application Publication No. 2005-101154 and Japanese Unexamined Patent Application Publication No. 2006-114895, the correction amount detection amplifier, the dummy laser diode, and the like are necessary. Accordingly, there arises a problem in that the circuit is complicated and the chip size is increased, which leads to an increase in costs.

SUMMARY

In one embodiment of the present invention, there is provided a current drive circuit including: a first current source and a second current source; a first current mirror to generate a first mirror current of a current generated by the second current source; a second current mirror to generate a second mirror current of the current generated by the second current source; and a third current mirror to generate a mirror current of a current which is generated by the first current source and which is corrected according to a difference between the first mirror current and the second mirror current, to supply the mirror current to a load.

According to the present invention, it is possible to provide a current drive circuit capable of suppressing current fluctuation due to power supply voltage variation, with a simpler circuit configuration than that of the prior art.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described. Note that the present invention is not limited to the embodiments described below. To make the description clear, the following description and drawings are simplified as appropriate.

First Embodiment

Figure 1:
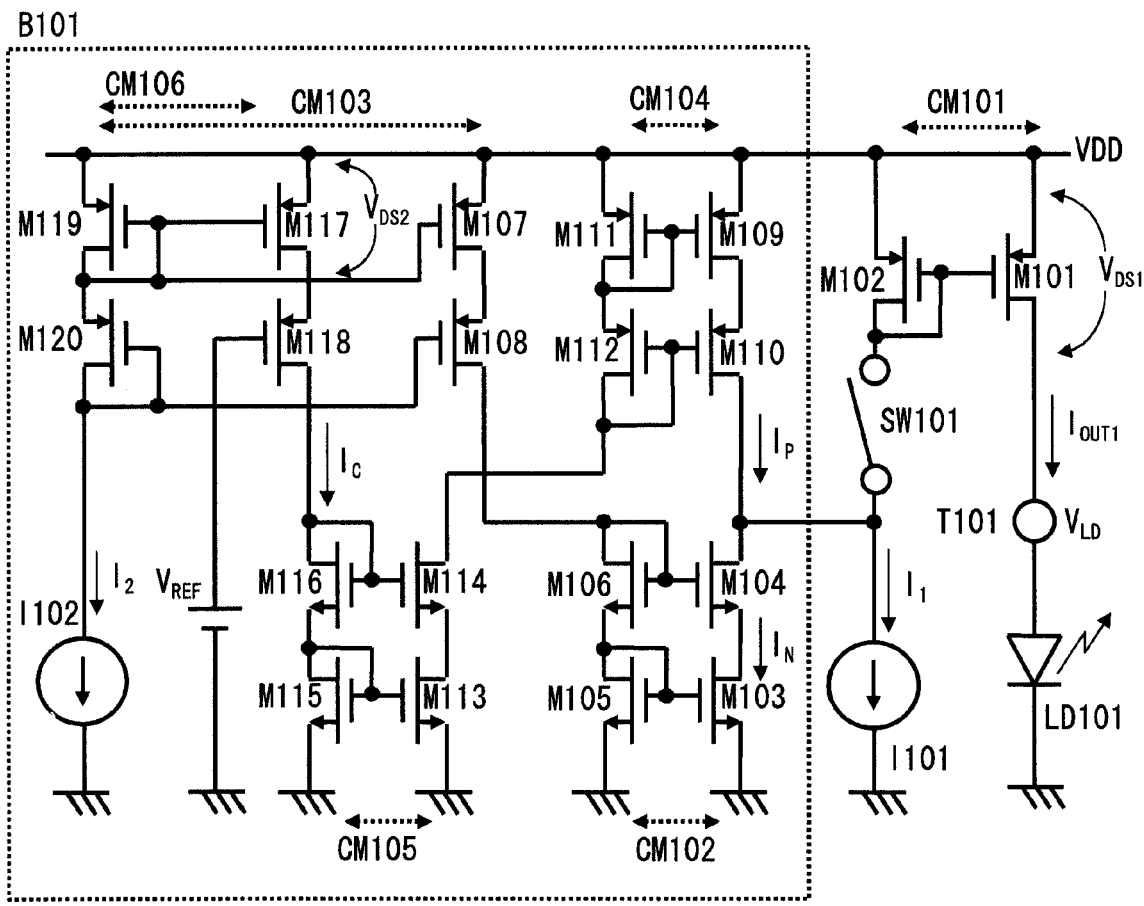
FIG. 1 is a circuit diagram showing a semiconductor circuit according to a first embodiment of the present invention.

Hereinafter, embodiments of the present invention will be described with reference to the drawings. FIG. 1 shows a circuit diagram of a current drive circuit according to a first embodiment of the present invention. As shown in FIG. 1, the current drive circuit according to the first embodiment includes a laser diode LD101, an output current setting current source I101, an LD output terminal T101, an output MOSFET M101, a MOSFET M102, an output ON/OFF switch SW101, and a correction circuit B101.

The correction circuit B101 includes a current source for setting correction current I102, a MOSFET M103, a MOSFET M104, a MOSFET M105, a MOSFET M106, a MOSFET M107, a MOSFET M108, a MOSFET M109, a MOSFET M110, a MOSFET M111, a MOSFET M112, a MOSFET M113, a MOSFET M114, a MOSFET M115, a MOSFET M116, a MOSFET M117, a MOSFET M118, a MOSFET M119, and a MOSFET M120.

The MOSFET M101, which is a P-channel MOSFET, has a source connected to a power supply VDD and a drain connected to one end of the laser diode LD101 via the LD output terminal T101. The other end of the laser diode LD101 is connected to a ground GND.

The MOSFET M102, which is a P-channel MOSFET, has a source connected to the power supply VDD and a drain connected to one end of the output current setting current source I101 via the output ON/OFF switch SW101. The other end of the output current setting current source I101 is connected to the ground GND. Further, a gate and the drain of the MOSFET M102 are connected together.

In this case, a gate of the MOSFET M101 and the gate of the MOSFET M102 are connected together. In other words, the MOSFET M101 and the MOSFET M102 constitute a current mirror CM101. As described above, it is necessary to supply a large current to the current mirror CM101 in a state where a sufficient amount of the voltage $V_{DS1}$ cannot be supplied. As a result, the current mirror CM101 cannot be implemented with a cascode configuration.

Both the MOSFET M103 and the MOSFET M104 are N-channel MOSFETs. The MOSFET M103 has a source connected to the ground GND, and a drain connected to a source of the MOSFET M104. That is, both the MOSFETs are connected in series.

Both the MOSFET M105 and the MOSFET M106 are N-channel MOSFETs. The MOSFET M105 has a source connected to the ground GND, and a drain connected to a source of the MOSFET M106. That is, both the MOSFETs are connected in series. Further, a gate and the drain of the MOSFET M105 are connected together, and a gate and a drain of the MOSFET M106 are connected together.

In this case, a gate of the MOSFET M103 is connected to the gate of the MOSFET M105. Further, a gate of the MOSFET M104 is connected to a gate of the MOSFET M106. That is, the MOSFET M103, the MOSFET M104, the MOSFET M105, and the MOSFET M106 constitute a cascode current mirror CM102.

Both the MOSFET M107 and the MOSFET M108 are P-channel MOSFETs. The MOSFET M107 has a source connected to the power supply VDD, and a drain connected to a source of the MOSFET M108. That is, both the MOSFETs are connected in series. A drain of the MOSFET M108 and the drain of the MOSFET M106 are connected in series.

Both the MOSFET M109 and the MOSFET M110 are P-channel MOSFETs. The MOSFET M109 has a source connected to the power supply VDD, and a drain connected to a source of the MOSFET M110. That is, both the MOSFETs are connected in series. A drain of the MOSFET M110 and a drain of the MOSFET M104 are connected in series. Further, a node between the MOSFET M110 and the MOSFET M104 is connected to a node between the switch SW101 and the current source I101. As a result, a correction current generated by the correction circuit B101 is supplied to the current drive circuit.

Both the MOSFET M111 and the MOSFET M112 are P-channel MOSFETs. The MOSFET M111 has a source connected to the power supply VDD, and a drain connected to a source of the MOSFET M112. That is, both the MOSFETs are connected in series. Further, a gate and the drain of the MOSFET M111 are connected together, and a gate and a drain of the MOSFET M112 are connected together.

In this case, a gate of the MOSFET M109 is connected to the gate of the MOSFET M111. Further, a gate of the MOSFET M110 is connected to the gate of the MOSFET M112. That is, the MOSFET M109, the MOSFET M110, the MOSFET M111, and the MOSFET M112 constitute a cascode current mirror CM104.

Both the MOSFET M113 and the MOSFET M114 are N-channel MOSFETs. The MOSFET M113 has a source connected to the ground GND, and a drain connected to a source of the MOSFET M114. That is, both the MOSFETs are connected in series. A drain of the MOSFET M114 and the drain of the MOSFET M112 are connected in series.

Both the MOSFET M115 and the MOSFET M116 are N-channel MOSFETs. The MOSFET M115 has a source connected to the ground GND, and a drain connected to a source of the MOSFET M116. That is, both the MOSFETs are connected in series. Further, a gate and the drain of the MOSFET M115 are connected together, and a gate and a drain of the MOSFET M116 are connected together.

In this case, a gate of the MOSFET M113 is connected to the gate of the MOSFET M115. Further, a gate of the MOSFET M114 is connected to the gate of the MOSFET M116. That is, the MOSFET M113, the MOSFET M114, the MOSFET M115, and the MOSFET M116 constitute a cascode current mirror CM105.

Both the MOSFET M117 and the MOSFET M118 are P-channel MOSFETs. The MOSFET M117 has a source connected to the power supply VDD, and a drain connected to a source of the MOSFET M118. That is, both the MOSFETs are connected in series. A gate of the MOSFET M118 is applied with a constant reference voltage $V_{REF}$. Further, a drain of the MOSFET M118 and the drain of the MOSFET M116 are connected in series.

Both the MOSFET M119 and the MOSFET M120 are P-channel MOSFETs. The MOSFET M119 has a source connected to power supply VDD, and a drain connected to a source of the MOSFET M120. That is, both the MOSFETs are connected in series. A drain of the MOSFET M120 is connected to one end of the current source I102. The other end of the current source I102 is connected to the ground GND. Further, a gate and the drain of the MOSFET M119 are connected together, and a gate and the drain of the MOSFET M120 are connected together.

In this case, a gate of the MOSFET M107 is connected to the gate of the MOSFET M119. Further, a gate of the MOSFET M108 is connected to the gate of the MOSFET M120. That is, the MOSFET M107, the MOSFET M108, the MOSFET M119, and the MOSFET M120 constitute a cascode current mirror CM103.

Further, a gate of the MOSFET M117 is connected to the gate of the MOSFET M119. Both the MOSFETs constitute a current mirror CM106.

Next, a description is given of a method of operating the current drive circuit shown in FIG. 1. Note that the description is made assuming that a mirror ratio of each of the current mirrors CM101 to CM106 is set to 1:1. First, a description is given of an operation of the current drive circuit in a case where the correction circuit B101 is not provided.

A current $I_1$ proportional to a desired current $I_{OUT1}$ that is caused to flow through the laser diode LD101 flows from the output current setting current source I101. When the output ON/OFF switch SW101 is turned on, the current is supplied as the current $I_{OUT1}$ to the laser diode LD101 via the current mirror CM101 and the LD output terminal T101, whereby the laser diode LD101 emits light.

The current $I_{OUT1}$ flowing through the laser diode LD101 when a voltage of the power supply VDD is V is represented by $I_{OUT1}=I_1$. Accordingly, a current $I_{OUT1}'$ obtained when the power supply voltage is shifted from the voltage V by $\Delta V_{DS}$ is represented by the following formula (1)

$$I_{OUT1}'=I_1\times(1+\alpha\Delta V_{DS}) \quad (1)$$

where α represents a channel length modulation effect coefficient.

Next, a description is given of operations of the correction circuit B101. A current $I_2$ proportional to the current $I_1$ flows from the correction current setting current source I102. The current flows as a current $I_N$ through the MOSFET M103 and the MOSFET M104 via the current mirrors CM103 and CM102. Since the current mirrors CM103 and CM102 have the cascode configuration, the current $I_N$ can be set constant regardless of the power supply voltage, whereby $I_N=I_2$ is satisfied.

On the other hand, the current $I_2$ also flows through the MOSFET M117 via the current mirror CM106. A current obtained when the power supply voltage is V is represented as a correction current $I_C$. The current flows as a current $I_P$ through the MOSFET M109 and the MOSFET M110 via the current mirrors CM105 and CM104. Since the current mirrors CM105 and CM104 have the cascode configuration, a relation between a current $I_C$ and the current $I_P$ is set so as to satisfy $I_P=I_C$ regardless of the power supply voltage. The correction current output from the correction circuit B101 is represented by $I_P-I_N$. Accordingly, the correction current is represented by $I_C-I_2$ as apparent from the above description.

In this case, when the power supply voltage is V, the MOSFET M118 and the voltage $V_{REF}$ to be applied to the gate thereof are set so as to satisfy $I_C=I_2$, that is, $I_P=I_N$. As a result, an output current of the correction circuit B101 becomes 0 when the power supply voltage is V, whereby $I_{OUT1}=I_1$ is satisfied.

Next, consideration is made of the output current of the correction circuit B101 in a case where the power supply voltage is shifted from the voltage V. Assuming that the current $I_C$ flowing through the MOSFET M117 when the power supply voltage is shifted from the voltage V by $\Delta V_{DS}$ is represented as $I_C'$, $I_C'=I_2\times(1+\alpha\Delta V_{DS})=I_P'$ is satisfied. Accordingly, when the power supply voltage is shifted by $\Delta V_{DS}$, the current: $I_{OUT1}'$ output to the laser diode LD101 is represented by the following formula (2).

$$\begin{aligned} I'_{OUT1} &= (I_1 - I'_P + I_N)\times(1+\alpha\Delta V_{DS}) \quad (2)\\ &= \{I_1 - I_2\times(1+\alpha\Delta V_{DS}) + I_2\}\times(1+\alpha\Delta V_{DS})\\ &= (I_1 - \alpha I_2\Delta V_{DS})\times(1+\alpha\Delta V_{DS})\\ &= I_1 + \alpha I_1\Delta V_{DS} - \alpha I_2\Delta V_{DS} - \alpha^2 I_2\Delta V_{DS}^2 \end{aligned}$$

When the following formula (3) is satisfied in the formula (2), the current $I_{OUT1}'$ output to the laser diode LD101 when the power supply voltage is shifted from the voltage V by $\Delta V_{DS}$, becomes $I_1$ regardless of power supply variations.

$$0=\alpha I_1\Delta V_{DS}-\alpha I_2\Delta V_{DS}-\alpha^2 I_2\Delta V_{DS} \quad (3)$$

Assuming that $I_2=aI_1$, where "a" is a constant, because the current $I_2$ is proportional to the current $I_1$, $$0 = \alpha I_1 \Delta V_{DS} - \alpha a I_1 \Delta V_{DS} - \alpha^2 a I1 \Delta V_{DS}^2$$
$$= 1 - a - a\alpha \Delta V_{DS}$$
$$= 1 - a \times (1 + \alpha \Delta V_{DS})$$

is established.

As a result, $a=1/(1+\alpha\Delta V_{DS})$ is satisfied. In this case, since $\alpha\Delta V_{DS}$ is about 0.05 under the condition of a power supply voltage variation of 10% in actual use, when a 0.95 is satisfied, the power supply variation in the current $I_{OUT1}$ can be suppressed.

Assuming that $\alpha\Delta V_{DS}=0.05$, a current fluctuation amount in a case where the correction circuit B101 is not provided is calculated according to the formula (1), $$(I'_{OUT1} - I_{OUT1})/I_{OUT1} \times 100 = \{I_1 \times (1+0.05) - I_1\}/I_1 \times 100$$
$$= 5\%$$

is established.

On the other hand, in the case of employing the correction circuit B101, when the mount of current fluctuation is calculated according to the formula (2) by substituting a=0.95, $$\frac{(I'_{OUT1} - I_{OUT1})}{I_{OUT1}} \times 100 = (0.05 - 0.95 \times 0.05 - 0.05^2 \times 0.95) \times 100$$
$$= 0.0125\%$$

is established. Thus, the current fluctuation amount is one four-hundredth of that in the case where the correction circuit is not provided. According to the present invention, the current fluctuation amount can be drastically reduced. Further, there is no need to provide a complicated circuit such as an amplifier as a correction circuit and the number of elements can be reduced, whereby a chip area of an IC can be reduced. The present invention is more effective particularly when a device having a plurality of laser diodes is used and when the current correction circuit has to be provided for each laser diode. Further, the present invention can be attained only with MOSFETs having the same size, and is capable of suppressing the fluctuation in the output current $I_{OUT1}$ due to variations in a manufacturing process.

Second Embodiment

Figure 2:
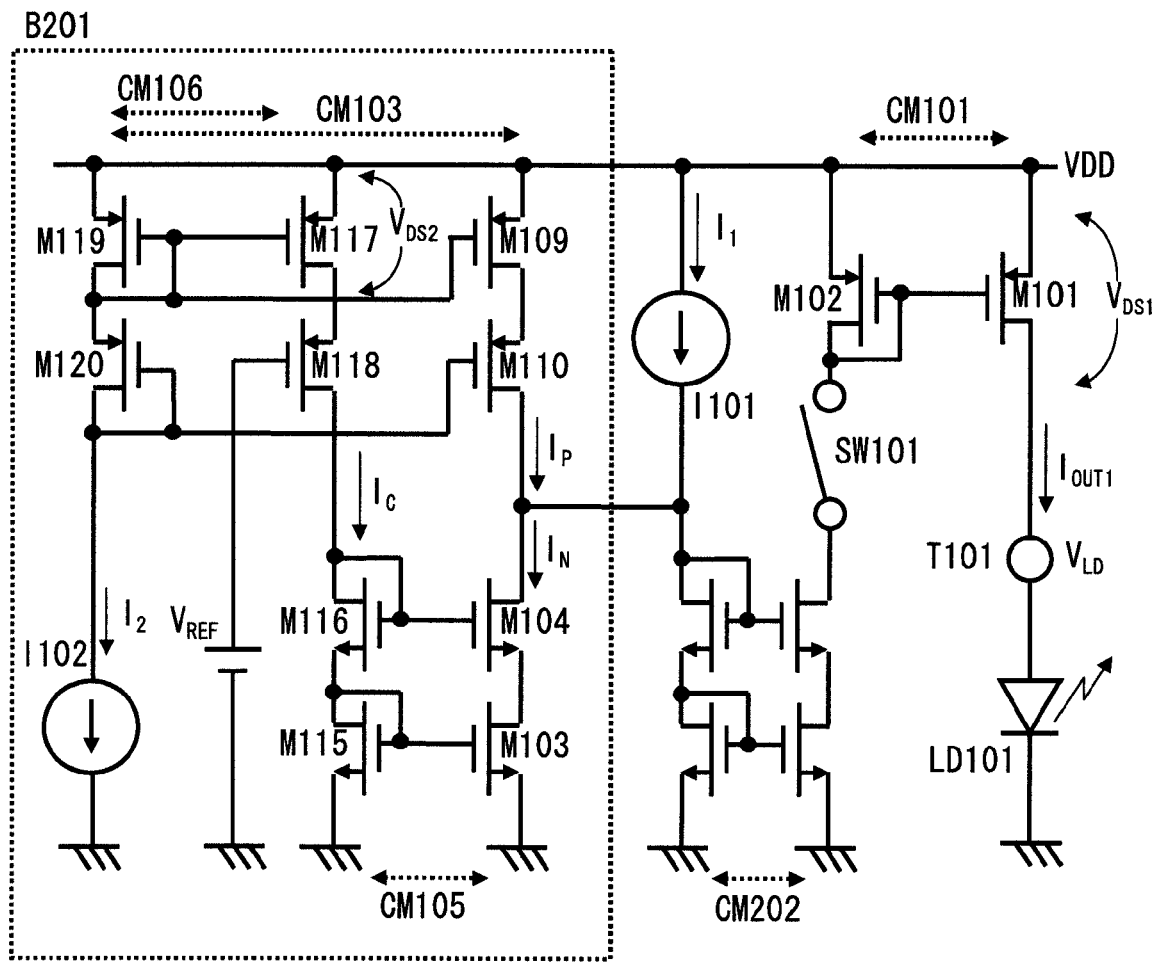
FIG. 2 is a circuit diagram showing a semiconductor circuit according to a second embodiment of the present invention.

Next, another embodiment of the present invention will be described. FIG. 2 shows a circuit diagram of a current drive circuit according to a second embodiment of the present invention. Circuit components identical with those of the first embodiment are denoted by the same reference symbols, and descriptions thereof are omitted as appropriate.

The current drive circuit shown in FIG. 2 includes a correction circuit B201. As compared with the correction circuit B101 shown in FIG. 1, the correction circuit B201 has a configuration in which the current mirrors CM102 and CM104 are omitted. Accordingly, $I_P=I_2$ and $I_N=I_C$ are satisfied, and the correction current output from the correction circuit B201 is represented by $I_P-I_N=I_2-I_C$. That is, a polarity of the correction current output from the correction circuit B201 is inverted from that of the correction current output from the correction circuit B101 shown in FIG. 1.

Therefore, the output current setting current source I101 is also disposed on the side of the power supply VDD. A current similar to that of the first embodiment is supplied to the laser diode LD101 via a cascode current mirror CM202 and the current mirror CM101. In the circuit of the second embodiment, the number of elements can be reduced and the number of loops in the current mirror is reduced as compared with the circuit of the first embodiment, with the result that a current error generated by the current mirror can be reduced, and the current correction against power supply variations can be performed with higher accuracy.

Third Embodiment

Figure 3:
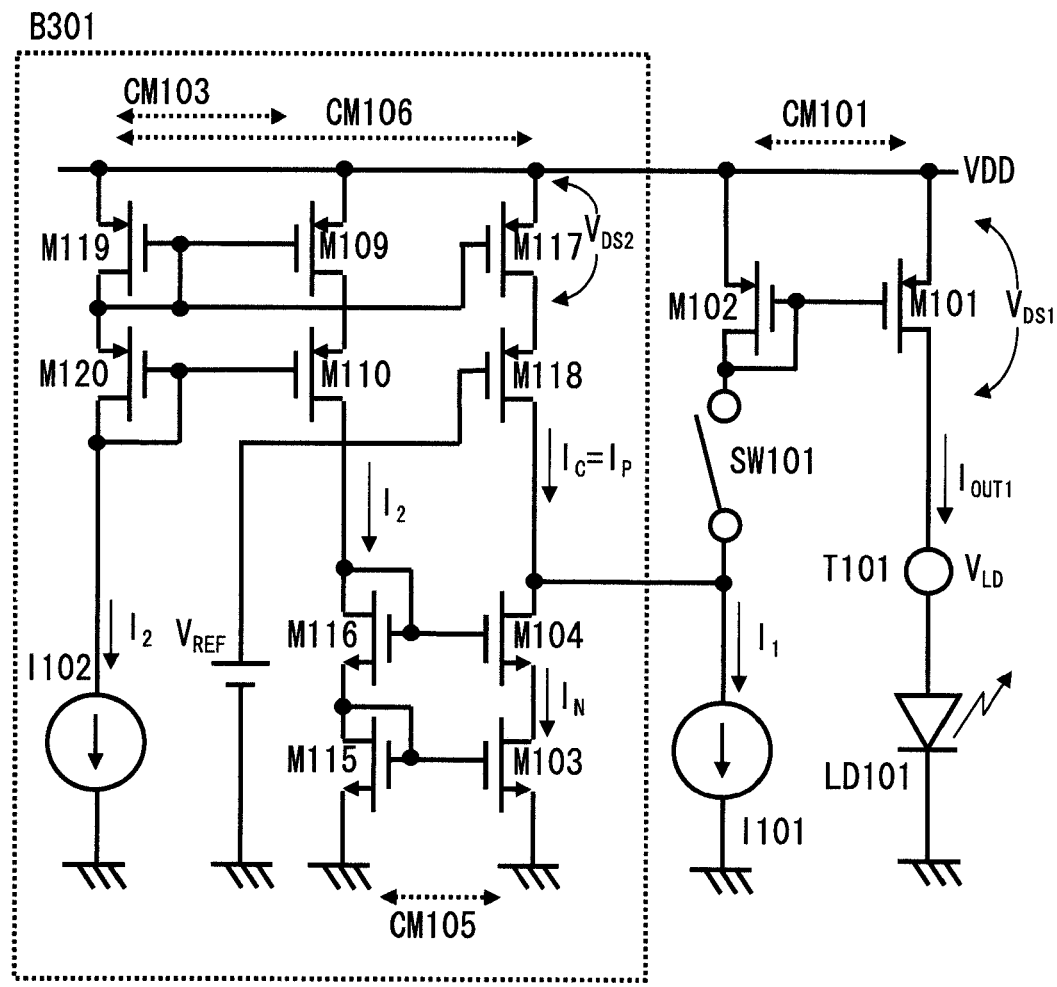
FIG. 3 is a circuit diagram showing a semiconductor circuit according to a third embodiment of the present invention.
Figure 4:
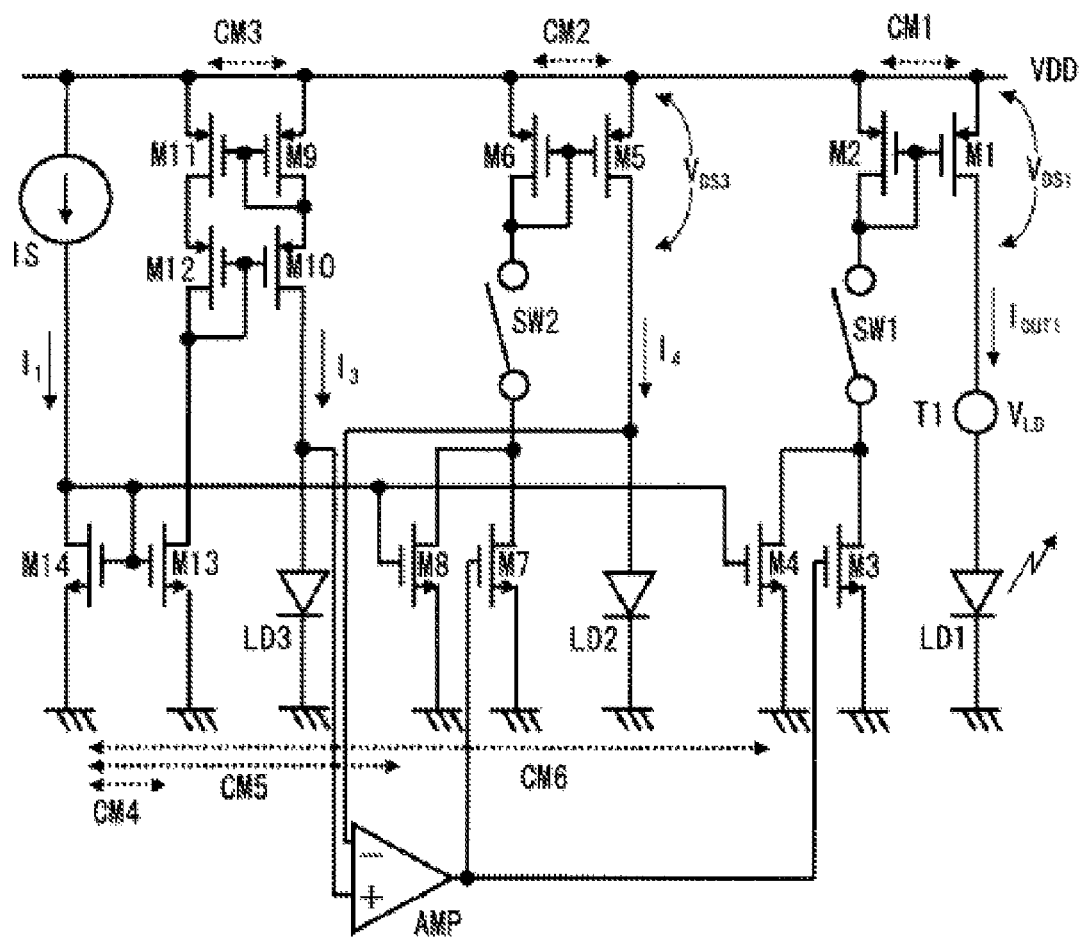
FIG. 4 is a circuit diagram showing a semiconductor circuit of a related art.

Next, still another embodiment of the present invention will be described. FIG. 3 shows a circuit diagram of a current drive circuit according to a third embodiment of the present invention. Circuit components identical with those of the first embodiment are denoted by the same reference symbols, and descriptions thereof are omitted as appropriate.

The current drive circuit shown in FIG. 3 includes a correction circuit B301. In the correction circuit B301, the current mirror CM202 is further omitted as compared with the correction circuit B201 shown in FIG. 2. Accordingly, $I_P=I_C$ and $I_N=I_2$ are satisfied, and a correction current output from the correction circuit B301 is represented by $I_P-I_N=I_C-I_2$. In other words, the correction current output from the correction circuit B301 becomes equal to the correction current output from the correction circuit B101 shown in FIG. 1.

Therefore, the MOSFET M109 and the MOSFET M117 are replaced with each other, and the MOSFET M110 and the MOSFET M118 are replaced with each other. As in the correction circuit B101 shown in FIG. 1, the output current setting current source I101 is disposed on the side of the ground GND. A current similar to that of the first embodiment is supplied to the laser diode LD101 via the current mirror CM101. In the circuit of the third embodiment, the number of elements can be further reduced and the number of loops in the current mirror is reduced as compared with the circuit of the second embodiment, with the result that a current error generated by the current mirror can be reduced, and the current correction against power supply variations can be performed with higher accuracy.

It is apparent that the present invention is not limited to the above embodiments, but may be modified and changed without departing from the scope and spirit of the invention.

What is claimed is:

1. A current drive circuit, comprising:
    a first current source and a second current source;
    a first current mirror to generate a first mirror current of a current generated by the second current source;
    a second current mirror to generate a second mirror current of the current generated by the second current source; and
    a third current mirror to generate a mirror current of a current which is generated by the first current source, said current generated by the first current source being corrected according to a difference between the first mirror current and the second mirror current, to supply the mirror current to a load.

2. The current drive circuit according to claim 1, wherein the first current mirror comprises a cascode current mirror including at least two pairs of MOS transistors.

3. The current drive circuit according to claim 1, wherein the second current mirror and the third current mirror each include a pair of MOS transistors.

4. The current drive circuit according to claim 3, wherein one of the pair of MOS transistors forming the second current mirror is connected in series with a MOS transistor having the same conductivity type as that of the one of the pair of MOS transistors and having a gate applied with a constant voltage.

5. The current drive circuit according to claim 1, wherein a plurality of MOS transistors forming each of the first current mirror, the second current mirror, and the third current mirror have the same size.

6. The current drive circuit according to claim 1, wherein the load comprises a laser diode.

* * * * *

UNITED STATES PATENT AND TRADEMARK OFFICE
CERTIFICATE OF CORRECTION

PATENT NO. : 8,094,695 B2
APPLICATION NO. : 12/179673
DATED : January 10, 2012
INVENTOR(S) : Makoto Sakaguchi It is certified that error appears in the above-identified patent and that said Letters Patent is hereby corrected as shown below:

In the Specification

Column 1, Line 47: Delete "MN1," and insert -- M11, --

Column 1, Line 55: Delete "MN1," and insert -- M11, --

Column 2, Line 50: Delete "$V_{D33}$" and insert -- $V_{DS3}$ --

Column 6, Line 53: Delete "$(I_1 - I'_P + I_N)$" and insert -- $(I_1 - I_P' + I_N)$ --

Column 6, Line 57: Delete "$\alpha^2 I_2 \Delta V_{DS}^2$" and insert -- $\alpha^2 I_2 \Delta V_{DS}{}^2$ --

Column 6, Line 63: Delete "$\Delta V_{DS}$," and insert -- $\Delta V_{DS}$ --

Column 6, Line 65: Delete "$\alpha^2 I_2 \Delta V_{DS}^2$" and insert -- $\alpha^2 I_2 \Delta V_{DS}{}^2$ --

Column 7, Line 1: Delete "$\alpha^2 a I1 \Delta V_{DS}^2$" and insert -- $\alpha^2 I_1 \Delta V_{DS}{}^2$ --

Column 7, Line 11: Delete "0.95" and insert -- ≈0.95 --

Signed and Sealed this
Twentieth Day of May, 2014

Michelle K. Lee
*Deputy Director of the United States Patent and Trademark Office*

CERTIFICATE OF CORRECTION (continued)
U.S. Pat. No. 8,094,695 B2

Column 7, Line 20: Delete "$(I'_{OUT1} - I_{OUT1})$," and insert -- $(I_{OUT1}' - I_{OUT1})$ --

Column 7, Line 30: Delete "$(I'_{OUT1} - I_{OUT1})$," and insert -- $(I_{OUT1}' - I_{OUT1})$ --